United States Patent
Lee et al.

(10) Patent No.: US 11,616,197 B2
(45) Date of Patent: Mar. 28, 2023

(54) VARIABLE RESISTANCE MEMORY DEVICE

(71) Applicant: SAMSUNG ELECTRONICS CO., LTD., Suwon-si (KR)

(72) Inventors: Ja Bin Lee, Hwaseong-si (KR); Zhe Wu, Seoul (KR); Kwangmin Park, Seoul (KR); Gwangguk An, Seoul (KR); Dongho Ahn, Hwaseong-si (KR); Seung-Geun Yu, Seoul (KR); Jinwoo Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 16/988,957

(22) Filed: Aug. 10, 2020

(65) Prior Publication Data

US 2021/0193922 A1    Jun. 24, 2021

(30) Foreign Application Priority Data

Dec. 24, 2019  (KR) .................. 10-2019-0174060

(51) Int. Cl.
*H01L 27/24*   (2006.01)
*H01L 45/00*   (2006.01)

(52) U.S. Cl.
CPC ........ *H01L 45/146* (2013.01); *H01L 27/2463* (2013.01); *H01L 45/1253* (2013.01); *H01L 45/144* (2013.01)

(58) Field of Classification Search
CPC ................. H01L 27/2409; H01L 27/2481
See application file for complete search history.

(56) References Cited

U.S. PATENT DOCUMENTS

| | | | |
|---|---|---|---|
| 8,634,236 | B2 | 1/2014 | Park et al. |
| 8,871,621 | B2 | 10/2014 | Ananthan et al. |
| 9,768,378 | B2 | 9/2017 | Pellizzer et al. |
| 10,026,780 | B2 | 7/2018 | Kamata |
| 10,283,707 | B2 | 5/2019 | Kamata |
| 10,305,033 | B2 | 5/2019 | Chang |
| 2013/0256624 | A1* | 10/2013 | Kau .............. H01L 45/12 257/4 |
| 2018/0331288 | A1 | 11/2018 | Pillarisetty et al. |
| 2019/0148455 | A1 | 5/2019 | Hong et al. |
| 2022/0109025 | A1* | 4/2022 | Majhi ............ H01L 27/224 |

\* cited by examiner

*Primary Examiner* — Mark V Prenty
(74) *Attorney, Agent, or Firm* — F. Chau & Associates, LLC

(57) ABSTRACT

A variable resistance memory device includes a plurality of memory cells arranged on a substrate. Each of the memory cells includes a selection element pattern and a variable resistance pattern stacked on the substrate. The selection element pattern includes a first selection element pattern having a chalcogenide material and a second selection element pattern having a metal oxide and coupled to the first selection element pattern.

18 Claims, 13 Drawing Sheets

VARIABLE RESISTANCE MEMORY DEVICE

CROSS-REFERENCE TO RELATED APPLICATIONS

This U.S. non-provisional patent application claims priority under 35 U.S.C. § 119 to Korean Patent Application No. 10-2019-0174060, filed on Dec. 24, 2019, in the Korean Intellectual Property Office, the disclosure of which is incorporated by reference herein.

BACKGROUND

1. Technical Field

The present disclosure relates to a semiconductor device, and more particularly, to a variable resistance memory device including a selection element.

2. Discussion of Related Art

Next-generation semiconductor memory devices are being developed to satisfy increasing demands for semiconductor memory devices with high performance and low power consumption. These next-generation semiconductor memory devices include magnetic random access memory (MRAM) and phase-change random access memory (PRAM). A memory cell of an MRAM or PRAM device has a resistance state that can be changed by a current or voltage applied thereto, which it retains even when a current or voltage supply to the device is later interrupted. A value of data stored in the memory cell can be changed by adjusting the corresponding resistance state.

SUMMARY

At least one embodiment of the inventive concept provides a variable resistance memory device with improved electric characteristics and reliability.

According to an embodiment of the inventive concept, a variable resistance memory device include memory cells arranged (e.g., horizontally) on a substrate. Each of the memory cells includes a selection element pattern and a variable resistance pattern stacked (e.g., vertically) on the substrate. The selection element pattern includes a first selection element pattern having a chalcogenide material and a second selection element pattern having a metal oxide and coupled to the first selection element pattern.

According to an exemplary embodiment of the inventive concept, a semiconductor device includes a plurality of first conductive lines disposed on a substrate and spaced apart from each other, a plurality of memory cells disposed on the first conductive lines, respectively, and a second conductive line. Each of the memory cells includes a selection element pattern and a variable resistance pattern stacked (e.g., vertically) on the substrate. The second conductive line is connected to the memory cells and is disposed to cross the first conductive lines. The selection element pattern includes a first selection element pattern having a chalcogenide material and a second selection element pattern having a metal oxide and being in physical contact with the first selection element pattern.

According to an exemplary embodiment of the inventive concept, a variable resistance memory device includes a substrate, a first conductive line disposed on the substrate and extending in a first direction, a second conductive line disposed on the first conductive line and extending in a second direction crossing the first direction, and a memory cell disposed between the first and second conductive lines and at an intersection of the first and second conductive lines. The memory cell includes a selection element pattern, a variable resistance pattern disposed on the selection element pattern, a first electrode disposed between the selection element pattern and the first conductive line, a second electrode disposed between the selection element pattern and the variable resistance pattern, and a third electrode disposed between the variable resistance pattern and the second conductive line. The selection element pattern includes a first selection element pattern having a chalcogenide material, and a second selection element pattern having a metal oxide and coupled to the first selection element pattern.

BRIEF DESCRIPTION OF THE DRAWINGS

Exemplary embodiments of the inventive concept will be more clearly understood from the following brief description taken in conjunction with the accompanying drawings.

The use of similar or identical reference numbers in the various drawings is intended to indicate the presence of a similar or identical element or feature.

DETAILED DESCRIPTION OF THE EXEMPLARY EMBODIMENTS

Figure 1:
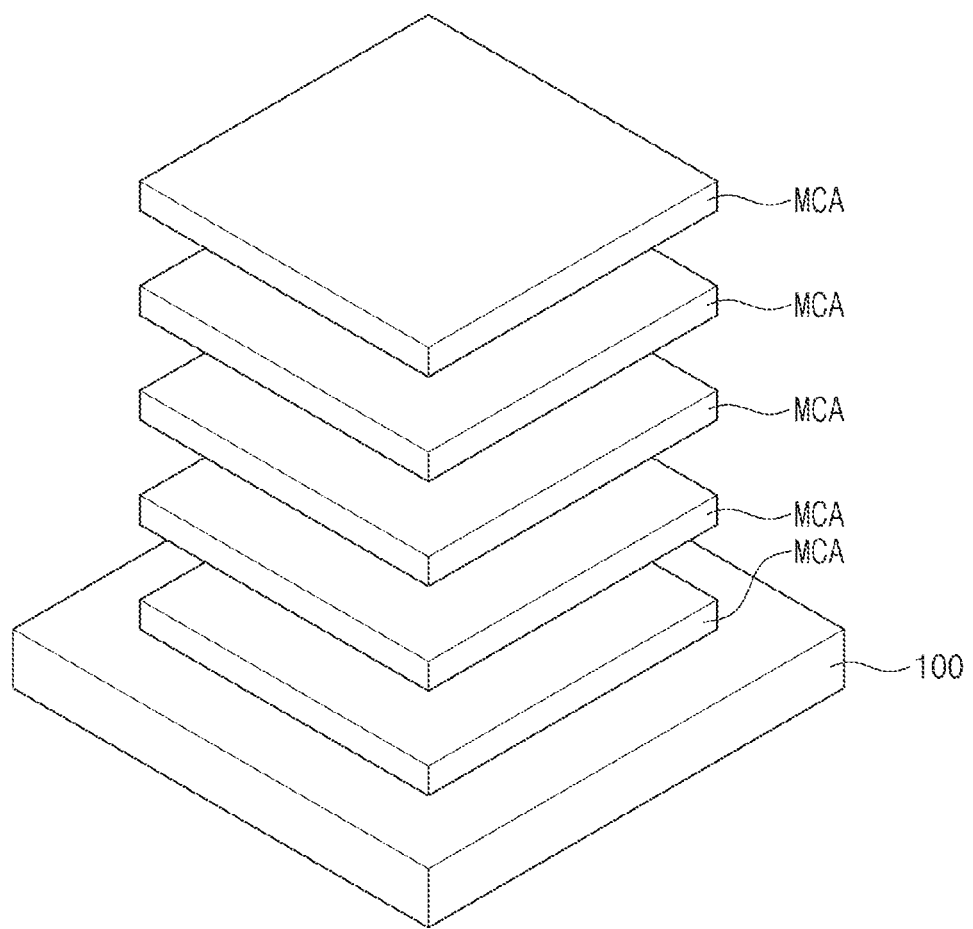
FIG. 1 is a conceptual diagram illustrating a semiconductor device according to an exemplary embodiment of the inventive concept.

The inventive concept will now be described more fully with reference to the accompanying drawings, in which exemplary embodiments thereof are shown. Like reference numerals in the drawings denote like elements, and thus their description will be omitted.

FIG. 1 is a conceptual diagram illustrating a semiconductor device according to an exemplary embodiment of the inventive concept.

Referring to FIG. 1, a semiconductor device include a plurality of memory cell stacks MCA, which are sequentially stacked on a substrate 100. Each of the memory cell stacks MCA may include a plurality of memory cells, which are two-dimensionally arranged on the substrate 100. The semiconductor device may include a plurality of conductive lines (e.g., word lines, bit lines, etc.). The conductive lines may be disposed between the memory cell stacks MCA and may be used to perform write, read, and/or erase operations on the memory cells. Although FIG. 1 illustrates five memory cell stacks MCA, the inventive concept is not limited to any particular number of the stacked memory cell stacks MCA. In an exemplary embodiment, the semiconductor device is a memory device (e.g., a variable resistance memory device).

Figure 2:
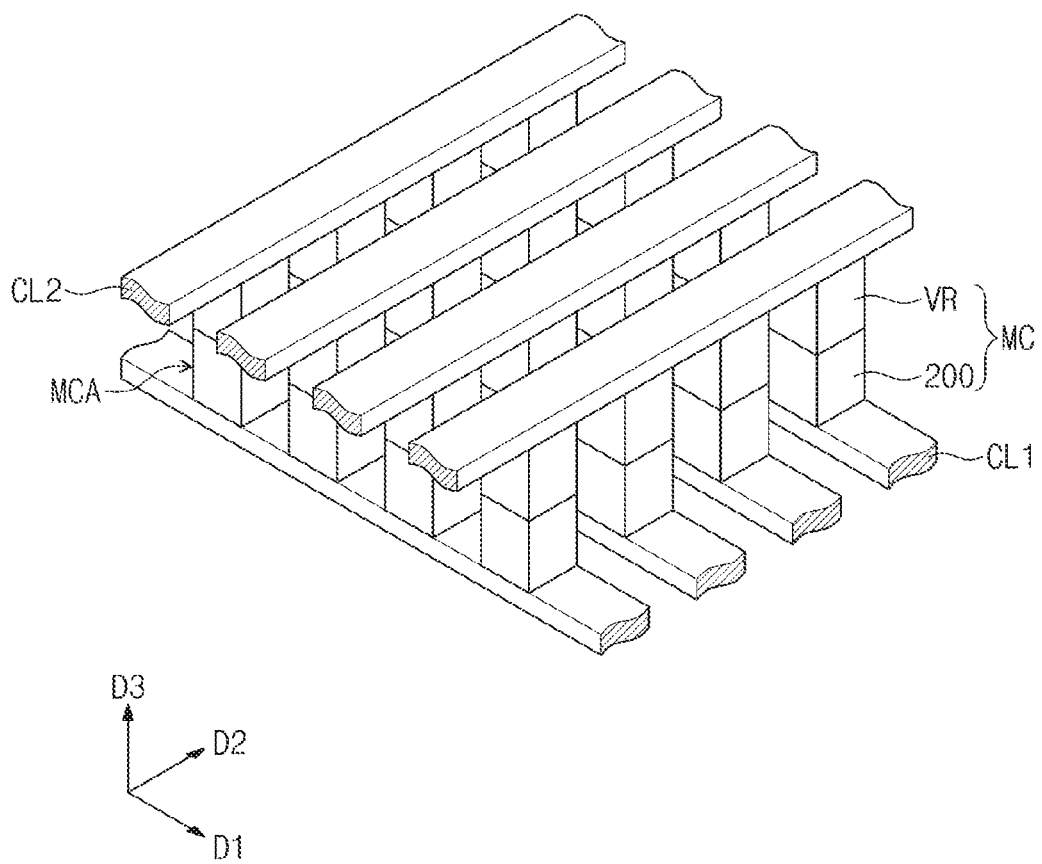
FIG. 2 is a perspective view schematically illustrating a semiconductor device according to an exemplary embodiment of the inventive concept.

FIG. 2 is a perspective view schematically illustrating a semiconductor device according to an exemplary embodiment of the inventive concept. FIG. 2 illustrates one memory cell stack MCA, but the inventive concept is not limited to this example.

Referring to FIG. 2, the semiconductor device includes first conductive lines CL1 and second conductive lines CL2, in addition to the memory cell stacks MCA. The first conductive lines CL1 may be elongated parallel to a first direction D1. For example, the first conductive lines CL1 may be arranged in parallel to one another, be spaced apart from one another and extend in the first direction D1. The second conductive lines CL2 may be elongated parallel to a second direction D2. For example, the second conductive lines CL2 may be arranged in parallel to one another, be spaced apart from one another and extend in the second direction D1. In an exemplary embodiment, the second direction D2 is not parallel to the first direction D1. For example, the second direction D2 may be perpendicular to the first direction D1. The second conductive lines CL2 may be spaced apart from the first conductive lines CL1 in a third direction D3. In an exemplary embodiment, the third direction D3 is substantially perpendicular to both of the first and second directions D1 and D2.

The memory cell stack MCA may be provided between the first conductive lines CL1 and the second conductive lines CL2. The memory cell stack MCA may include a plurality of memory cells MC, each of which is provided at a corresponding one of intersections (e.g., intersection regions) of the first and second conductive lines CL1 and CL2. For example, the memory cells MC may be two-dimensionally arranged to form a plurality of rows and a plurality of columns.

In an exemplary embodiment, each of the memory cells MC includes a variable resistance pattern VR and a selection element pattern 200. The variable resistance pattern VR and the selection element pattern 200 may be provided between a pair of the conductive lines CL1 and CL2 connected thereto and may be connected in series to each other. As an example, the variable resistance pattern VR and the selection element pattern 200, which are included in each of the memory cells MC, may be connected in series to each other, between a corresponding pair of the first and second conductive lines CL1 and CL2. FIG. 2 illustrates an example, in which the variable resistance pattern VR is provided on a top surface of the selection element pattern 200, but the inventive concept is not limited to this example. For example, unlike that shown in FIG. 2, the selection element pattern 200 may be provided on a top surface of the variable resistance pattern VR.

Figure 3:
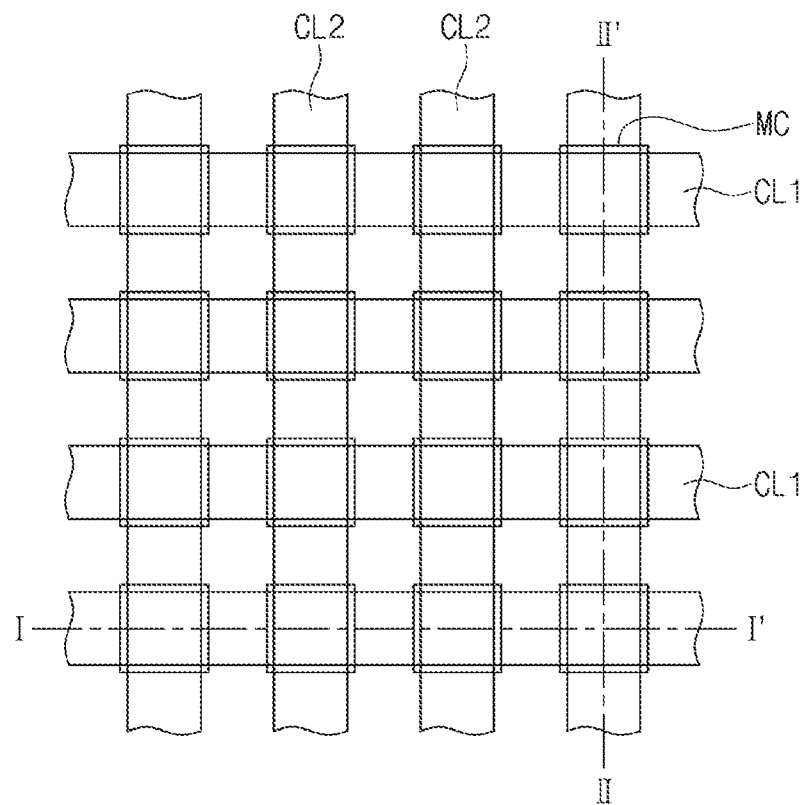
FIG. 3 is a plan view illustrating a variable resistance memory device according to an exemplary embodiment of the inventive concept.
Figure 3:
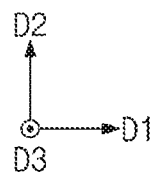
Figure 4:
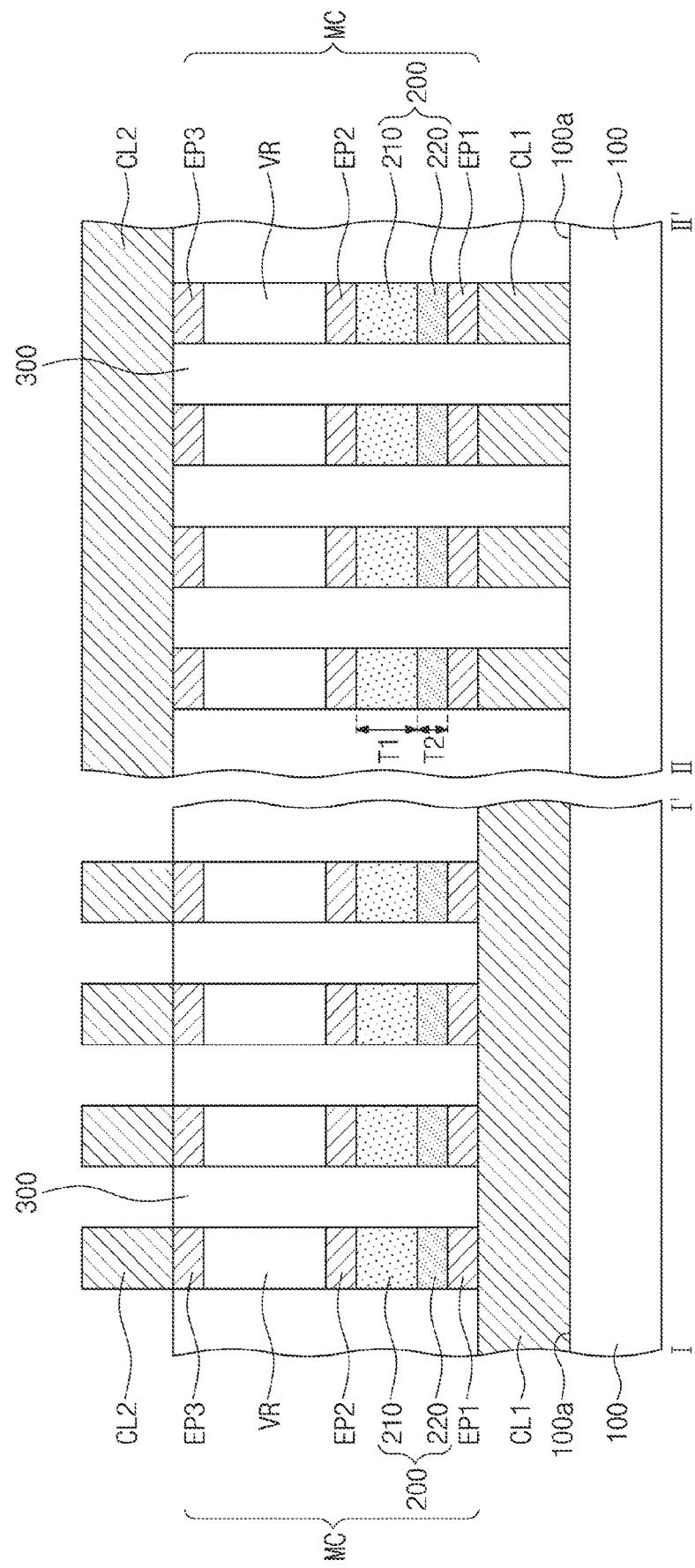
FIG. 4 is a sectional view taken along lines I-I' and II-II' of FIG. 3.

FIG. 3 is a plan view illustrating a variable resistance memory device according to an exemplary embodiment of the inventive concept. FIG. 4 is a sectional view taken along lines I-I' and II-II' of FIG. 3. For the sake of brevity, the variable resistance memory device will be described based on one of the memory cell stacks MCA.

Referring to FIGS. 3 and 4, the semiconductor device includes a mold layer 300, the substrate 100, the first conductive lines CL1, the memory cells MC, and the second conductive lines CL2. Each of the memory cells MC may include a first electrode pattern EP1, the selection element pattern 200, a second electrode pattern EP2, the variable resistance pattern VR, and a third electrode pattern EP3, which are stacked on the substrate 100, as shown in FIG. 4.

The first conductive lines CL1 may be provided on the substrate 100. The substrate 100 may include a semiconductor substrate. In an exemplary embodiment, the substrate 100 is entirely made from a semiconductor material. As shown in FIG. 3, the first conductive lines CL1 may extend in the first direction D1 and be spaced apart from each other in the second direction D2. The first direction D1 may be parallel to a top surface 100a of the substrate 100. The second direction D2 is not parallel to the first direction D1. The first conductive lines CL1 may be formed of or include at least one of metallic materials (e.g., copper, tungsten, and aluminum) and/or metal nitrides (e.g., tantalum nitride, titanium nitride, and tungsten nitride).

The second conductive lines CL2 may be provided on the substrate 100 to cross the first conductive lines CL1. The second conductive lines CL2 may extend in the second direction D2 and be spaced apart from each other in the first direction D1. The second conductive lines CL2 may be spaced apart from the first conductive lines CL1 in the third direction D3. The third direction D3 may be perpendicular to the top surface 100a of the substrate 100. The second conductive lines CL2 may be formed of or include at least one of metallic materials (e.g., copper, tungsten, and aluminum) and/or metal nitrides (e.g., tantalum nitride, titanium nitride, and tungsten nitride). The first conductive lines CL1 may serve as word lines, and the second conductive lines CL2 may serve as bit lines. Alternatively, the first conductive lines CL1 may serve as the bit lines, and the second conductive lines CL2 may serve as the word lines.

The memory cells MC may be disposed between the first conductive lines CL1 and the second conductive lines CL2 and at respective intersections between the first conductive lines CL1 and the second conductive lines CL2. The memory cells MC may be two-dimensionally arranged in the first direction D1 and the second direction D2. The two-dimensionally-arranged memory cells MC may constitute each of the memory cell stacks MCA. Each of the memory cells MC may be provided between a corresponding one of the first conductive lines CL1 and a corresponding one of the second conductive lines CL2.

Each of the memory cells MC may include the variable resistance pattern VR and the selection element pattern 200, as previously described with reference to FIG. 2. The variable resistance pattern VR and the selection element pattern 200 may be connected in series to each other, between each corresponding pair of the first and second conductive lines CL1 and CL2. As an example, the variable resistance pattern VR may be an island-shaped pattern, which is locally provided at an intersection of each corresponding pair of the first and second conductive lines CL1 and CL2, and the selection element pattern 200 may be an island-shaped pattern, which is locally provided at an intersection of each corresponding pair of the first and second conductive lines CL1 and CL2. The selection element pattern 200 may be disposed between the substrate 100 and the variable resistance pattern VR. However, the inventive concept is not limited to this example. For example, the variable resistance pattern VR may be provided between the substrate 100 and the selection element pattern 200.

In an exemplary embodiment of the inventive concept, the variable resistance pattern VR includes a material having a variable resistance property, which makes it possible to use the variable resistance pattern VR as a data-storing element. As an example, the variable resistance pattern VR may be formed of or include a phase-changeable material, whose crystalline structure can be reversibly switched to one of crystalline and amorphous states depending on its temperature. The variable resistance pattern VR may include a compound containing at least one of chalcogen elements (e.g., Te and Se) and at least one of Ge, Sb, Bi, Pb, Sn, Ag, As, S, Si, In, Ti, Ga, P, O, and C. As an example, the variable resistance pattern VR may be formed of or include at least one of GeSbTe, GeTeAs, SbTeSe, GeTe, SbTe, SeTeSn, GeTeSe, SbSeBi, GeBiTe, GeTeTi, InSe, GaTeSe, or InSbTe. As another example, the variable resistance pattern VR may have a super lattice structure, in which a Ge-containing layer (e.g., GeTe layer) and a Ge-free layer (e.g., SbTe layer) are repeatedly stacked.

As another example, the variable resistance pattern VR may be formed of or include at least one of perovskite compounds, transition metal oxides, magnetic materials, ferromagnetic materials, or antiferromagnetic materials, instead of the phase-changeable material.

In an exemplary embodiment, the selection element pattern 200 includes a switching device. For example, the selection element pattern 200 may be a device, which has a non-linear (e.g., S-shaped) I-V curve, based on a threshold switching phenomenon.

In an exemplary embodiment, the selection element pattern 200 includes a first selection element pattern 210 and a second selection element pattern 220, which are in contact with each other. The first selection element pattern 210 may include an ovonic threshold switch (OTS) device exhibiting a bi-directional property. In an exemplary embodiment, the first selection element pattern 210 has a crystalline-amorphous phase-transition temperature that is higher than that of the variable resistance pattern VR. Accordingly, the phase of a phase-changeable pattern may be reversibly changed from the crystalline phase to the amorphous phase or vice versa, during an operation of the variable resistance memory device, but the phase of the switching device SW may be maintained substantially at the amorphous phase without a change of its phase. Here, the substantially amorphous phase (or state) does not exclude a crystalline structure of an object, in which crystalline grains locally exist or a locally crystallized portion exists. The first selection element pattern 210 may be formed of or include at least one of a plurality of chalcogenide materials. The chalcogenide materials may include compounds containing at least one of a plurality of chalcogen elements (e.g., Te and Se) and at least one of Ge, Sb, Bi, Al, Pb, Sn, Ag, As, S, Si, In, Ti, Ga, and P. The chalcogenide materials may, for example, include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe. The first selection element pattern 210 may include at least one of a compound formed by combination of two kinds of elements (e.g., a binary element compound material), a compound formed by combination of three kinds of elements (e.g., a ternary element compound material), a compound formed by combination of four kinds of elements (e.g., a quaternary element compound material), a compound formed by combination of five kinds of elements (e.g., a quinary element compound material), and a compound formed by combination of six kinds of elements (e.g., a senary element compound material). The compound formed by combination of two kinds of elements may include GeSe, GeS, AsSe, AsTe, AsS SiTe, SiSe, SiS, GeAs, SiAs, SnSe, and/or SnTe. The compound formed by combination of three kinds of elements may include GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and/or SnAsTe, The compound formed by combination of four kinds of elements may include GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and/or GeAsTeZn. The compound formed by combination of five kinds of elements may include GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and/or GeAsSeZnSn. The compound formed by combination of six kinds of elements may include GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and/or GeAsSeSAlSn. As an example, the first selection element pattern 210 may further include an additional element (e.g., at least one of C, N, B, or O). As another example, the first selection element pattern 210 may further include oxide and/or nitride which contains at least one of Si, Hf, Zr, W, V, Nb, Ti, Ta, Mo, or Mg. The first selection element pattern 210 may have a first conductivity type. The first conductivity type may be, for example, a p-type. As other example, the first selection element pattern 210 may include multi-layer.

The second selection element pattern 220 may be interposed between the substrate 100 and the first selection element pattern 210. The second selection element pattern 220 may be coupled to the first selection element pattern 210. For example, a top surface of the second selection element pattern 220 may be in physical contact with the first selection element pattern 210. In an exemplary embodiment of the inventive concept, the second selection element pattern 220 is formed of or includes a material different from the first selection element pattern 210. The second selection element pattern 220 may be formed of or include a metal oxide and may have a second conductivity type. In an exemplary embodiment of the inventive concept, the second conductivity type is different from the first conductivity type. For example, the second conductivity type may be an n-type. For example, the second selection element pattern 220 may be formed of or include a compound, which is composed of at least one metallic element, which is selected from the group consisting of zinc (Zn), indium (In), gallium (Ga), and tin (Sn), and oxygen (O). As an example, the second selection element pattern 220 may be formed of or include at least one of a compound formed by combination of two kinds of elements (e.g., a binary element compound material) such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and/or NdSb, a compound formed by combination of three kinds of elements (e.g., a ternary element compound material) such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and/or NdSbS, a compound formed by combination of four kinds of elements (e.g., a quaternary element compound material) such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and/or NdGeSbS, and a compound formed by combination of five kinds of elements (e.g., a quinary element compound material) such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and/or GeSbSeZnSn. The second selection element pattern 220 may further include an additional element, which contains at least one of C, N, B, P, Cd, W, Ti, Hf, or Zr. As another example, the second selection element pattern 220 may further include oxide and/or nitride which contains at least one of Si, Hf, Zr, W, V, Nb, Ti, Ta, Mo, or Mg. For example, the second selection element pattern 220 may be formed of or include InTiZnO (ITZO; Indium Titanium Zinc Oxide). As other example, the second selection element pattern 220 may include multi-layer.

In an exemplary embodiment of the inventive concept, the first and second selection element patterns 210 and 220, which are in physical contact with each other, form a pn junction. Accordingly, during operations of the semiconductor device, the selection element pattern 200 may behave as a rectifying element, which may improve electrical characteristics (e.g., threshold voltage and/or leakage current) of the memory cell MC. As a result, the reliability of the semiconductor device may be improved.

In an exemplary embodiment, the second selection element pattern 220 has the same or substantially the same planar area as the first selection element pattern 210. For example, the second selection element pattern 220 may have substantially the same width and length as those of the first selection element pattern 210. In an exemplary embodiment, the second selection element pattern 220 fully overlaps with the first selection element pattern 210, when viewed in a plan view.

In an exemplary embodiment of the inventive concept, an energy band gap of the second selection element pattern 220 is greater than an energy band gap of the first selection element pattern 210. For example, the energy band gap of the second selection element pattern 220 may range from about 2.3 eV to about 4.0 eV. The energy band gap of the first selection element pattern 210 may range from about 1.1 eV to about 2.25 eV. Since the energy band gap of the second selection element pattern 220 is greater than that of the first selection element pattern 210, a leakage current of the selection element pattern 200 may be more effectively reduced.

In an exemplary embodiment of the inventive concept, a thickness T2 of the second selection element pattern 220 is smaller than a thickness T1 of the first selection element pattern 210. The thickness T2 of the second selection element pattern 220 may be about 5% to 17% of the thickness T1 of the first selection element pattern 210. In the case where the thickness T2 of the second selection element pattern 220 is smaller than 5% of the thickness T1 of the first selection element pattern 210, a process of depositing the second selection element pattern 220 may become excessively complex or the second selection element pattern 220 may have a non-uniform thickness or composition. In the case where the thickness T2 of the second selection element pattern 220 is greater than 17% of the thickness T1 of the first selection element pattern 210, a switching property of the selection element pattern 200 may deteriorate. The thickness T2 of the second selection element pattern 220 may range, for example, from 4 Å to 50 Å. The thickness T1 of the first selection element pattern 210 may range, for example, from 80 Å to 300 Å. In the case where the thickness T2 of the second selection element pattern 220 is smaller than 4 Å, the process of depositing the second selection element pattern 220 may become excessively complex or the second selection element pattern 220 may have a non-uniform thickness or composition. In the case where the thickness T2 of the second selection element pattern 220 is greater than 50 Å, the switching property of the selection element pattern 200 may deteriorate.

Each of the memory cells MC may further include at least one of the first electrode pattern EP1, the second electrode pattern EP2, and the third electrode pattern EP3, in addition to the selection element pattern 200 and the variable resistance pattern VR.

The first electrode pattern EP1 may be disposed between the selection element pattern 200 and a corresponding one of the first conductive lines CL1. The selection element pattern 200 may be connected to a corresponding one of the first conductive lines CL1 through the first electrode pattern EP1. In an exemplary embodiment of the inventive concept, the first electrode pattern EP1 is formed of or includes a material whose resistivity is higher than the first and second conductive lines CL1 and CL2. The first electrode pattern EP1 may be formed of or include at least one of metal- or carbon-containing materials. For example, the first electrode pattern EP1 may be formed of or include at least one of W, Ti, Al, Cu, C, CN, TiN, TiAlN, TiSiN, TiCN, WN, CoSiN, WSiN, TaN, TaCN, TaSiN, and/or TiO. The second selection element pattern 220 may be in contact with the first electrode pattern EP1.

The second electrode pattern EP2 may be provided between the selection element pattern 200 and the variable resistance pattern VR. In an exemplary embodiment, the second electrode pattern EP2 is spaced apart from the first electrode pattern EP1 with the selection element pattern 200 interposed therebetween. The second electrode pattern EP2 may electrically connect the selection element pattern 200 to the variable resistance pattern VR and may prevent the selection element pattern 200 from being in direct contact with the variable resistance pattern VR. The second electrode pattern EP2 may be formed of or include at least one of metal- or carbon-containing materials. For example, the second electrode pattern EP2 may be formed of or include at least one of W, Ti, Al, Cu, C, CN, TiN, TiAlN, TiSiN, TiCN, WN, CoSiN, WSiN, TaN, TaCN, and/or TaSiN. The second electrode pattern EP2 may be in physical contact with the first selection element pattern 210.

The third electrode pattern EP3 may be disposed between the variable resistance pattern VR and a corresponding one of the second conductive lines CL2. The variable resistance pattern VR may be connected to a corresponding one of the second conductive lines CL2 through the third electrode pattern EP3. In an exemplary embodiment, the third electrode pattern EP3 is spaced apart from the second electrode pattern EP2 with the variable resistance pattern VR interposed therebetween. In an exemplary embodiment, the third electrode pattern EP3 has an island-shaped pattern, which is locally provided at an intersection of a corresponding pair of the first and second conductive lines CL1 and CL2. The third electrode pattern EP3 may be formed of or include at least one of metal- or carbon-containing materials. For example, the third electrode pattern EP3 may be formed of or include at least one of W, Ti, Al, Cu, C, CN, TiN, TiAlN, TiSiN, TiCN, WN, CoSiN, WSiN, TaN, TaCN, TaSiN, and/or TiO.

The mold layer 300 may be disposed on the substrate 100 and the first conductive lines CL1. The mold layer 300 may be provided to fill gap regions between the side surfaces of the memory cells MC. For example, the mold layer 300 may be provided on the top surface 100a of the substrate 100, the top surfaces of the first conductive lines CL1, the side surfaces of the first electrode pattern EP1, the side surfaces of the first and second selection element patterns 210 and 220, the side surfaces of the second electrode pattern EP2, the side surfaces of the variable resistance pattern VR, and the side surfaces of the third electrode pattern EP3. The mold layer 300 may be formed of or include at silicon-containing insulating material. For example, the mold layer 300 may be formed of or include at least one of SiN, SiON, SiC, SiCN, SiOC, SiOCN, $SiO_2$, or $Al_2O_3$. Although not shown, the mold layer 300 may include a plurality of layers.

The second conductive lines CL2 may be disposed on the mold layer 300 and the third electrode pattern EP3. The second conductive lines CL2 may be provided to have substantially the same features as those described above.

Figure 5:
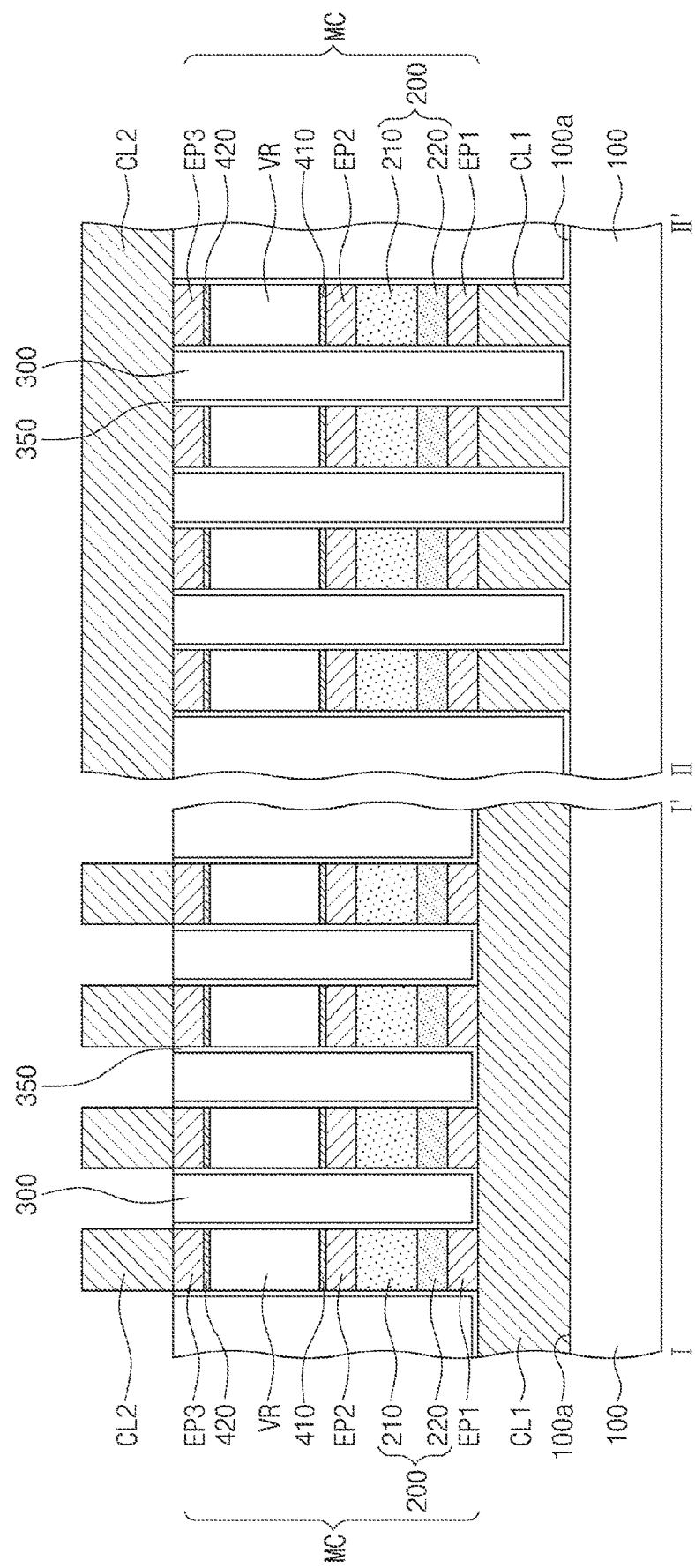
FIG. 5 is a sectional view illustrating a semiconductor device according to an exemplary embodiment of the inventive concept, taken along lines I-I' and II-II' of FIG. 3.

FIG. 5 is a sectional view illustrating a semiconductor device according to an exemplary embodiment of the inventive concept, taken along lines I-I' and II-II' of FIG. 3. For concise description, a previously described element may be identified by the same reference number without repeating an overlapping description thereof.

Referring to FIGS. 3 and 5, the semiconductor device may further include a first barrier pattern 410, a second barrier pattern 420, and a passivation pattern 350, in addition to the substrate 100, the first conductive lines CL1, the first electrode pattern EP1, the selection element pattern 200, the second electrode pattern EP2, the variable resistance pattern VR, the third electrode pattern EP3, the mold layer 300, and the second conductive lines CL2.

The first barrier pattern 410 may be interposed between the second electrode pattern EP2 and the variable resistance pattern VR. Due to the first barrier pattern 410, the variable resistance pattern VR is not in physical contact with the second electrode pattern EP2. For example, a first side of the first barrier pattern 410 may contact the second electrode pattern EP2 and a second side of the first barrier pattern 410 opposing the first side may contact the variable resistance pattern VR. The first barrier pattern 410 may prevent a material in the variable resistance pattern VR from being diffused into the second electrode pattern EP2. The first barrier pattern 410 may be formed of or include at least one of metallic materials and/or metal nitrides. As an example, the first barrier pattern 410 may be formed of or include at least one of W and/or WN. As another example, the first barrier pattern 410 may be formed of or include at least one of Ti, Ta, TiN, and/or TaN.

The second barrier pattern 420 may be interposed between the variable resistance pattern VR and the third electrode pattern EP3. Due to the second barrier pattern 420, the variable resistance pattern VR is not in physical contact with the third electrode pattern EP3. For example, a first side of the second barrier pattern 420 may contact the second electrode pattern EP3 and a second side of the second barrier pattern 420 opposing the first side may contact the variable resistance pattern VR. The second barrier pattern 420 may prevent a material in the variable resistance pattern VR from being diffused into the third electrode pattern EP3. The second barrier pattern 420 may be formed of or include at least one of metallic materials and/or metal nitrides. As an example, the second barrier pattern 420 may be formed of or include at least one of W and/or WN. As another example, the second barrier pattern 420 may be formed of or include at least one of Ti, Ta, TiN, and/or TaN.

The passivation pattern 350 may be interposed between the substrate 100 and the mold layer 300, between the first conductive lines CL1 and the mold layer 300, and between the memory cells MC and the mold layer 300. The passivation pattern 350 may cover the side and top surfaces of the first conductive lines CL1, the side surfaces of the first electrode pattern EP1, the side surfaces of the first and second selection element patterns 210 and 220, the side surfaces of the second electrode pattern EP2, the side surfaces of the variable resistance pattern VR, and the side surfaces of the third electrode pattern EP3. In an exemplary embodiment, the passivation pattern 350 is not interposed between the mold layer 300 and the conductive lines CL2. For example, an upper surface of the mold layer 300 may contact a lower surface of a conductive line CL2. The passivation pattern 350 may be formed of or include at least one of silicon-containing insulating materials. In an exemplary embodiment, the passivation pattern 350 is formed of or include a material different from the mold layer 300. For example, the passivation pattern 350 may be formed of or include at least one of SiN, SiO$_2$, SiON, SiBN, SiCN, SiOCN, Al$_2$O$_3$, AN, and/or AlON. The passivation pattern 350 may have a single-layered structure or a multi-layered structure (e.g., a double-layered structure).

Although not shown in the drawings, at least one of the first barrier pattern 410, the second barrier pattern 420, and the passivation pattern 350 may be omitted.

Figure 6:
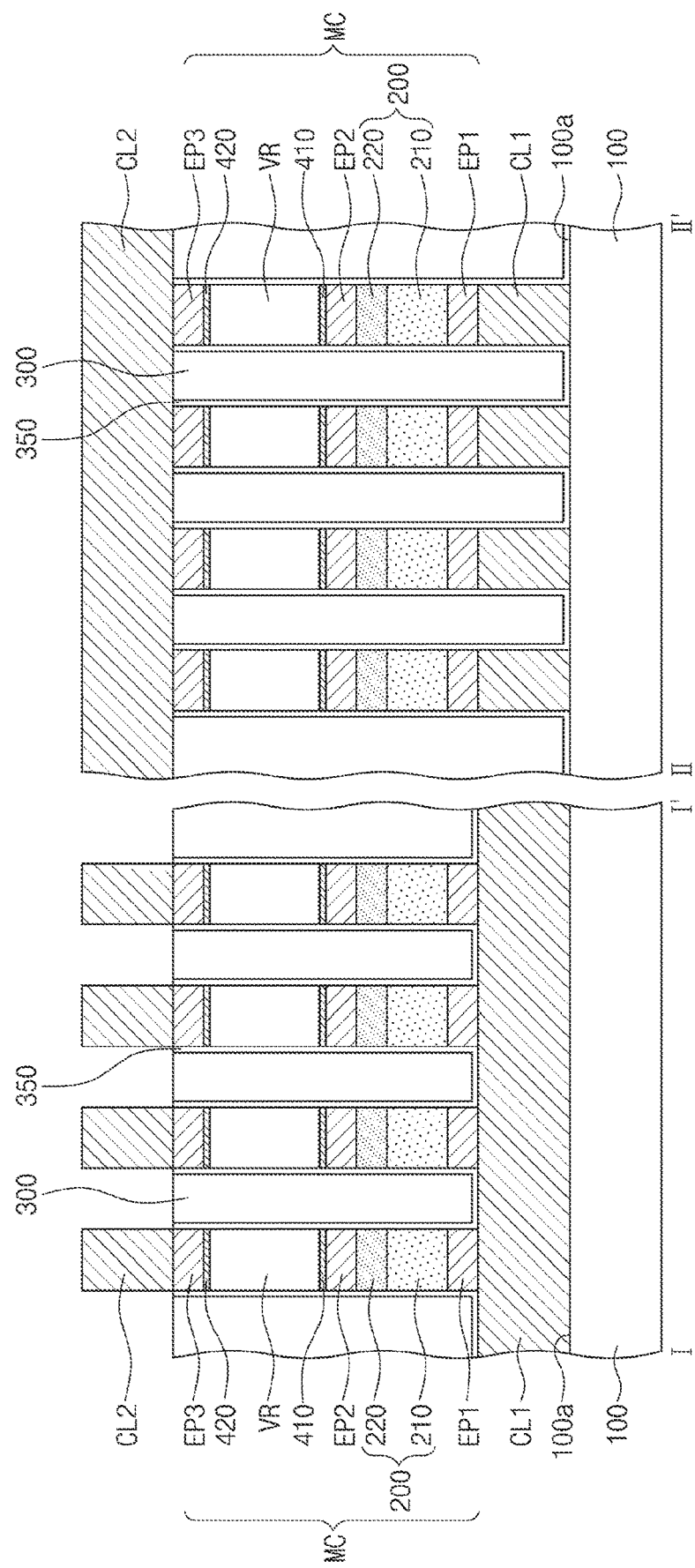
FIG. 6 is a sectional view illustrating a semiconductor device according to an exemplary embodiment of the inventive concept.

FIG. 6 is a sectional view illustrating a semiconductor device according to an exemplary embodiment of the inventive concept, taken along lines I-I' and II-II' of FIG. 3. For concise description, a previously described element may be identified by the same reference number without repeating an overlapping description thereof.

Referring to FIGS. 3 and 6, the semiconductor device may include the substrate 100, the first conductive lines CL1, the memory cells MC, the mold layer 300, the second conductive lines CL2, and the passivation pattern 350. Each of the memory cells MC may include the first electrode pattern EP1, the first and second selection element patterns 210 and 220, the second electrode pattern EP2, the first barrier pattern 410, the variable resistance pattern VR, the second barrier pattern 420, and the third electrode pattern EP3, as described with reference to FIGS. 3 to 5.

However, according to an exemplary embodiment of the inventive concept, the second selection element pattern 220 is interposed between the top surface of the first selection element pattern 210 and the second electrode pattern EP2. In an exemplary embodiment, the bottom surface of the second selection element pattern 220 is in contact with the top surface of the first selection element pattern 210, and the top surface of the second selection element pattern 220 is in contact with the second electrode pattern EP2. Further, in FIG. 6, the first selection element pattern EP1 is interposed between a first conductive line CL1 and the second selection element pattern 220.

Figure 7A:
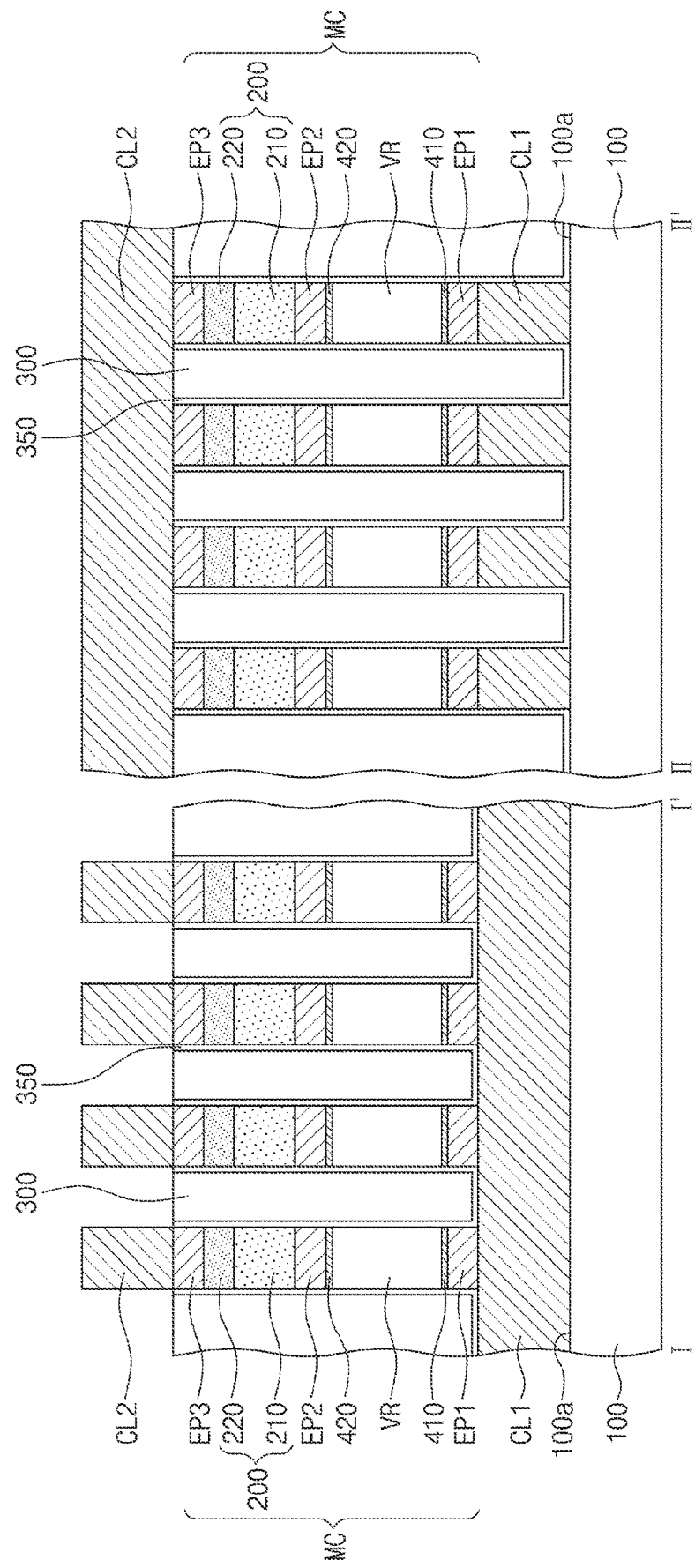
FIG. 7A is a sectional view illustrating a semiconductor device according to an exemplary embodiment of the inventive concept.
Figure 7B:
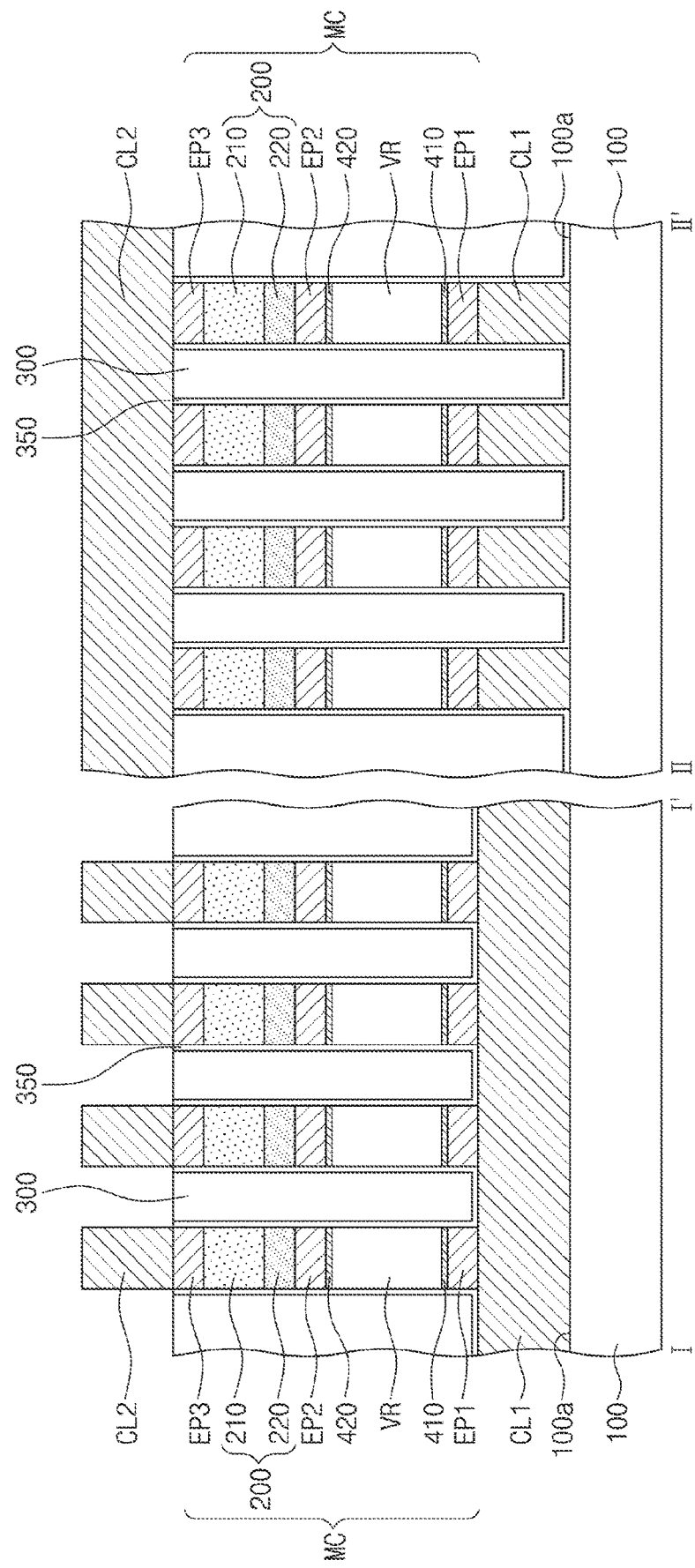
FIG. 7B is a sectional view illustrating a semiconductor device according to an exemplary embodiment of the inventive concept.

FIG. 7A is a sectional view illustrating a semiconductor device according to an exemplary embodiment of the inventive concept, taken along lines I-I' and II-II' of FIG. 3. FIG. 7B is a sectional view illustrating a semiconductor device according to an embodiment of the inventive concept, taken along lines I-I' and II-II' of FIG. 3. For concise description, a previously described element may be identified by the same reference number without repeating an overlapping description thereof. This embodiment will be described with reference to FIGS. 7A and 7B, along with FIG. 3.

Referring to FIGS. 7A and 7B, the semiconductor device may include the substrate 100, the first conductive lines CL1, the memory cells MC, the second conductive lines CL2, the mold layer 300, and the passivation pattern 350. Each of the memory cells MC may include the first electrode pattern EP1, the first barrier pattern 410, the variable resistance pattern VR, the second barrier pattern 420, the second electrode pattern EP2, the selection element pattern 200, and the third electrode pattern EP3, which are stacked on the substrate 100.

The variable resistance pattern VR may be disposed between the substrate 100 and the selection element pattern 200. The first electrode pattern EP1 may be disposed on a top surface of a corresponding one of the first conductive lines CL1. The third electrode pattern EP3 may be interposed between the selection element pattern 200 and a corresponding one of the second conductive lines CL2.

As shown in FIG. 7A, the second selection element pattern 220 may be interposed between the top surface of the first selection element pattern 210 and the third electrode pattern EP3 to be in contact with the top surface of the first selection element pattern 210.

As shown in FIG. 7B, the second selection element pattern 220 may be interposed between the bottom surface of the first selection element pattern 210 and the second electrode pattern EP2 to be in contact with the bottom surface of the first selection element pattern 210.

Figure 8A:
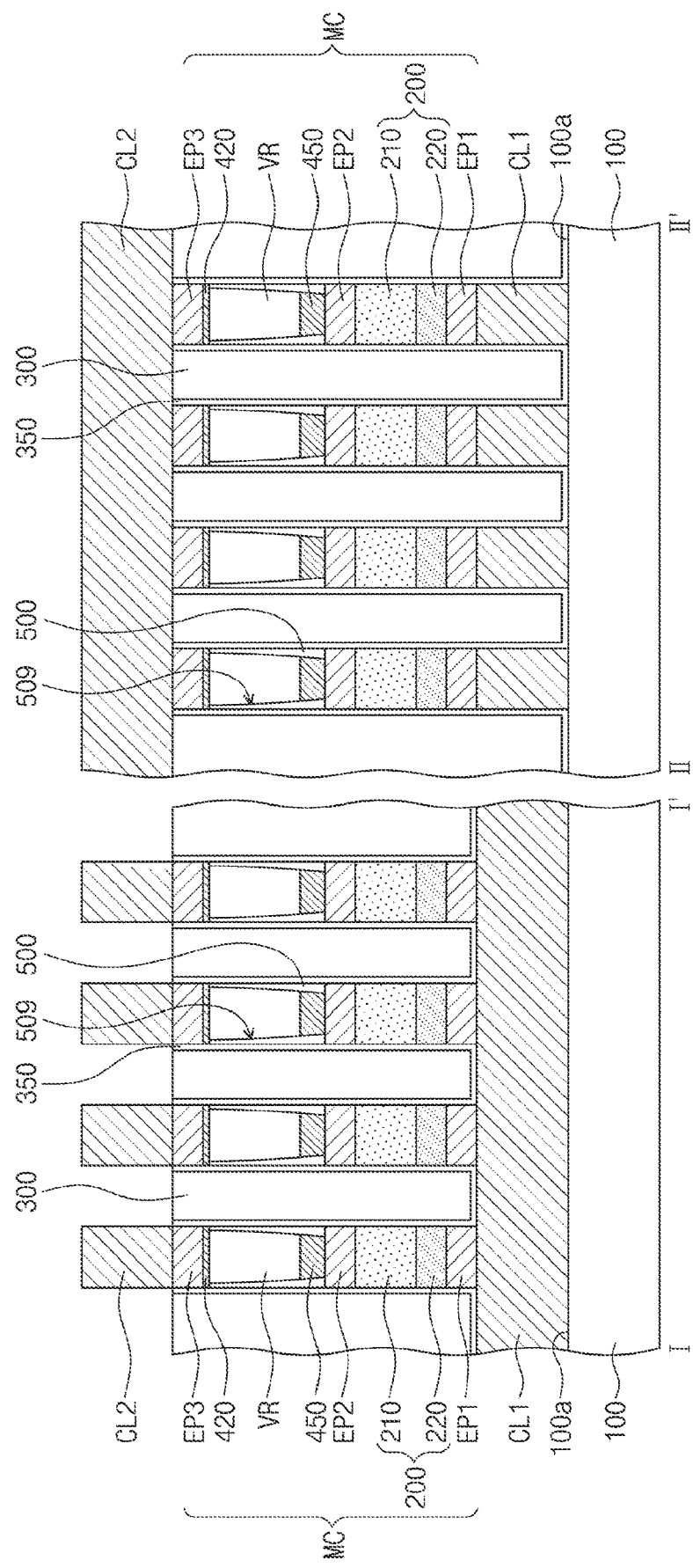
FIG. 8A is a sectional view illustrating a semiconductor device according to an exemplary embodiment of the inventive concept.
Figure 8B:
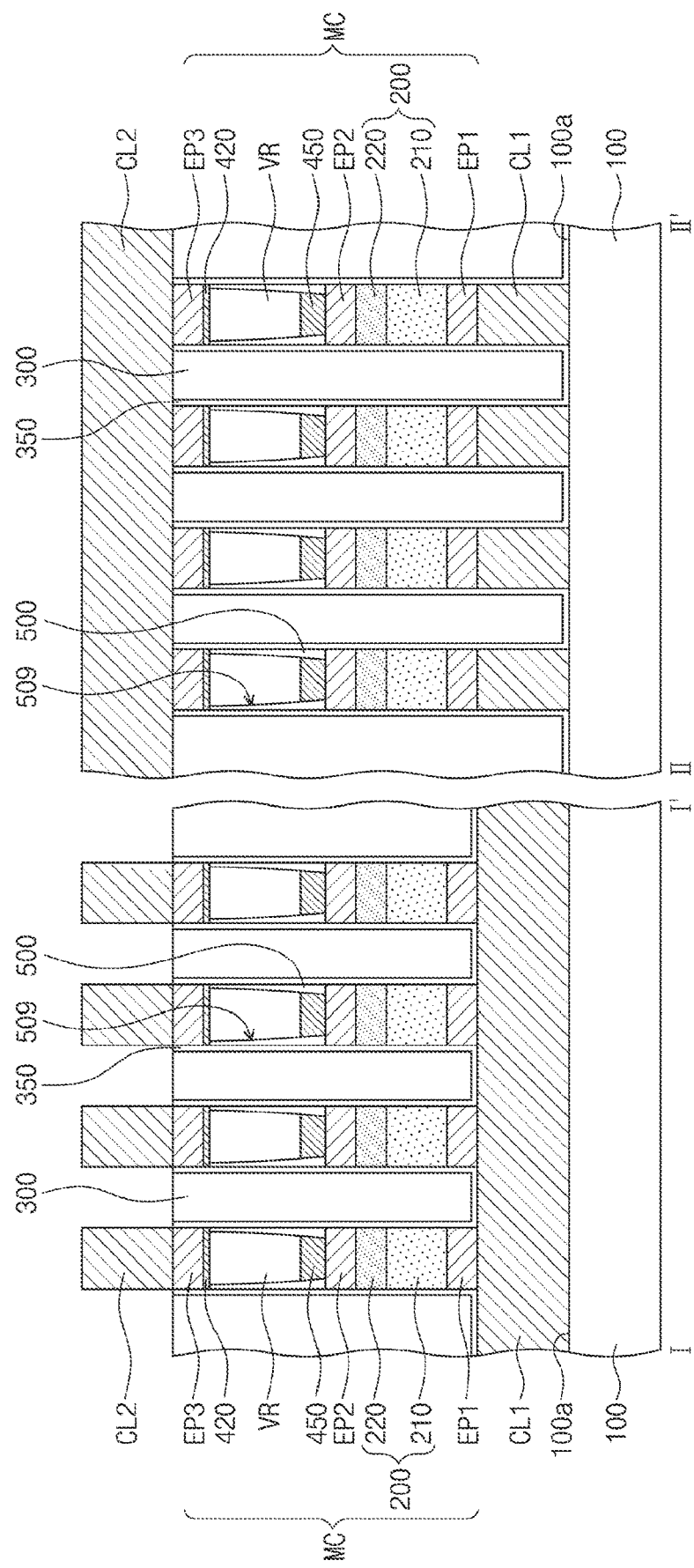
FIG. 8B is a sectional view illustrating a semiconductor device according to an exemplary embodiment of the inventive concept.

FIG. 8A is a sectional view illustrating a semiconductor device according to an exemplary embodiment of the inventive concept, taken along lines I-I' and II-II' of FIG. 3. FIG. 8B is a sectional view illustrating a semiconductor device according to an embodiment of the inventive concept, taken along lines I-I' and II-II' of FIG. 3. For concise description, a previously described element may be identified by the same reference number without repeating an overlapping description thereof. This embodiment will be described with reference to FIGS. 8A and 8B, along with FIG. 3.

Referring to FIGS. 8A and 8B, the semiconductor device may further include an insulating pattern 500, in addition to the substrate 100, the first conductive lines CL1, the memory cells MC, the mold layer 300, the second conductive lines CL2, and the passivation pattern 350. Each of the memory cells MC may include the first electrode pattern EP1, the selection element pattern 200, the second electrode pattern EP2, the variable resistance pattern VR, the second barrier pattern 420, and the third electrode pattern EP3, which are sequentially stacked on the substrate 100.

In an exemplary embodiment, the insulating pattern 500 is disposed on the top surface of the second electrode pattern EP2. In an exemplary embodiment, the insulating pattern 500 is disposed between the second barrier pattern 420 and the second electrode pattern EP2. The insulating pattern 500 may have a trench 509, and the trench 509 may be recessed from a top surface of the insulating pattern 500. The trench 509 may be provided to penetrate the insulating pattern 500 and to expose the second electrode pattern EP2.

In an exemplary embodiment, each of the memory cells MC includes a lower barrier layer 450. The lower barrier layer 450 may be provided in a lower region of the trench 509. The lower barrier layer 450 may be disposed between the second electrode pattern EP2 and the variable resistance pattern VR. The lower barrier layer 450 may be electrically connected to the second electrode pattern EP2 and the variable resistance pattern VR. The lower barrier layer 450 may be formed of or include a conductive material. The lower barrier layer 450 may be formed of or include, for example, titanium (Ti) and/or titanium nitride (TiN). In an embodiment, the lower barrier layer 450 may be formed of or include at least one of W, WN, Ta, and/or TaN. The lower barrier layer 450 may be formed of or include a material different from the second barrier pattern 420, but the inventive concept is not limited to this example.

The variable resistance pattern VR may be disposed on the top surface of the lower barrier layer 450 to fill a remaining empty region of the trench 509. The top surface of the variable resistance pattern VR may be located at the same or substantially the same level as the top surface of the insulating pattern 500. The variable resistance pattern VR may be electrically connected to the second electrode pattern EP2 through the lower barrier layer 450. Due to the lower barrier layer 450, the variable resistance pattern VR is not in physical contact with the second electrode pattern EP2. The lower barrier layer 450 may prevent a material in the variable resistance pattern VR from being diffused into the second electrode pattern EP2. Although not shown, the first barrier pattern 410 described with reference to FIG. 5 may be further interposed between the second electrode pattern EP2 and the lower barrier layer 450. The first barrier pattern 410 may be further extended into a region between the second electrode pattern EP2 and the insulating pattern 500.

As shown in FIG. 8A, the second selection element pattern 220 may be interposed between the bottom surface of the first selection element pattern 210 and the first electrode pattern EP1 to be in contact with the bottom surface of the first selection element pattern 210.

As shown in FIG. 8B, the second selection element pattern 220 may be interposed between the top surface of the first selection element pattern 210 and the second electrode pattern EP2 to be in contact with the top surface of the first selection element pattern 210.

Figure 9A:
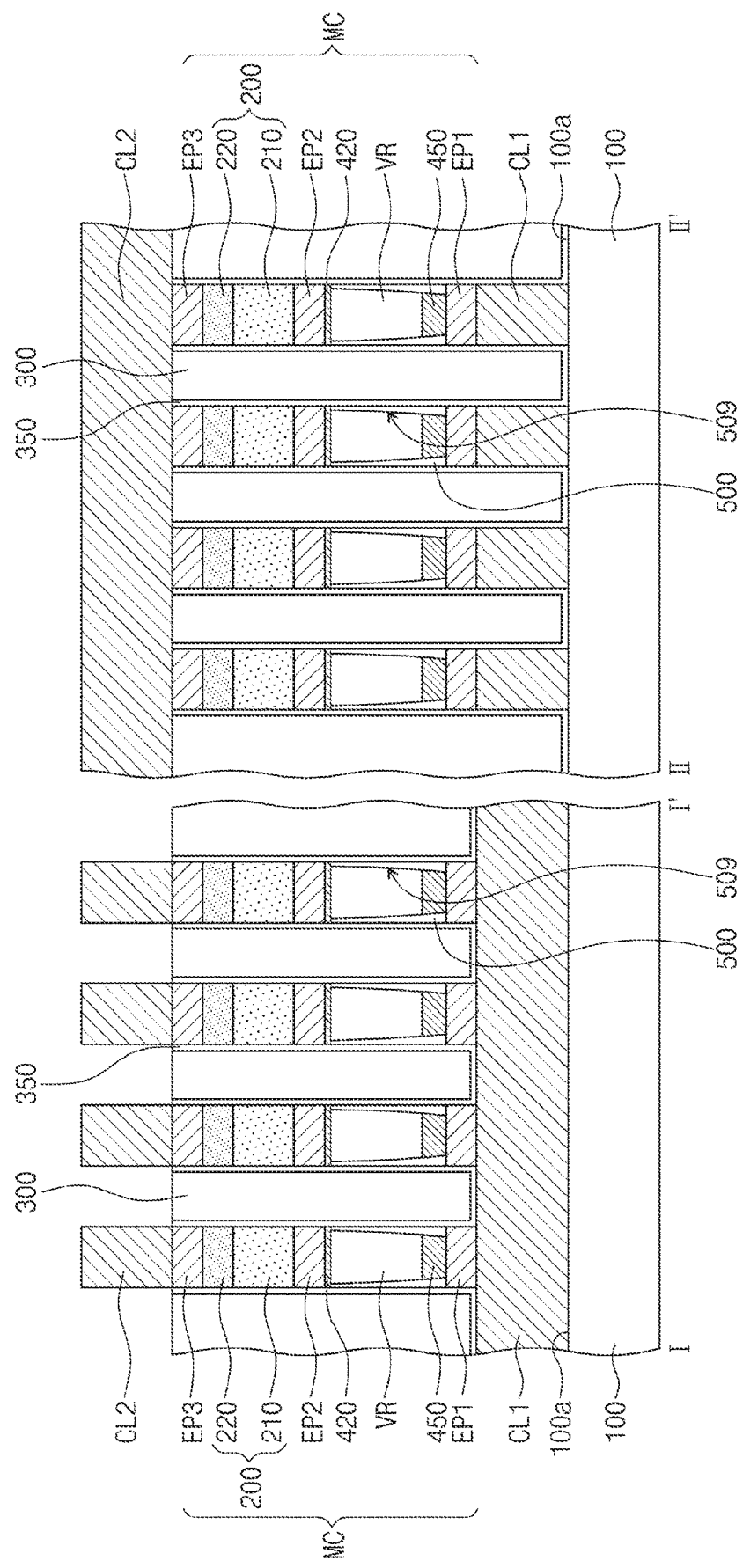
FIG. 9A is a sectional view illustrating a semiconductor device according to an exemplary embodiment of the inventive concept.
Figure 9B:
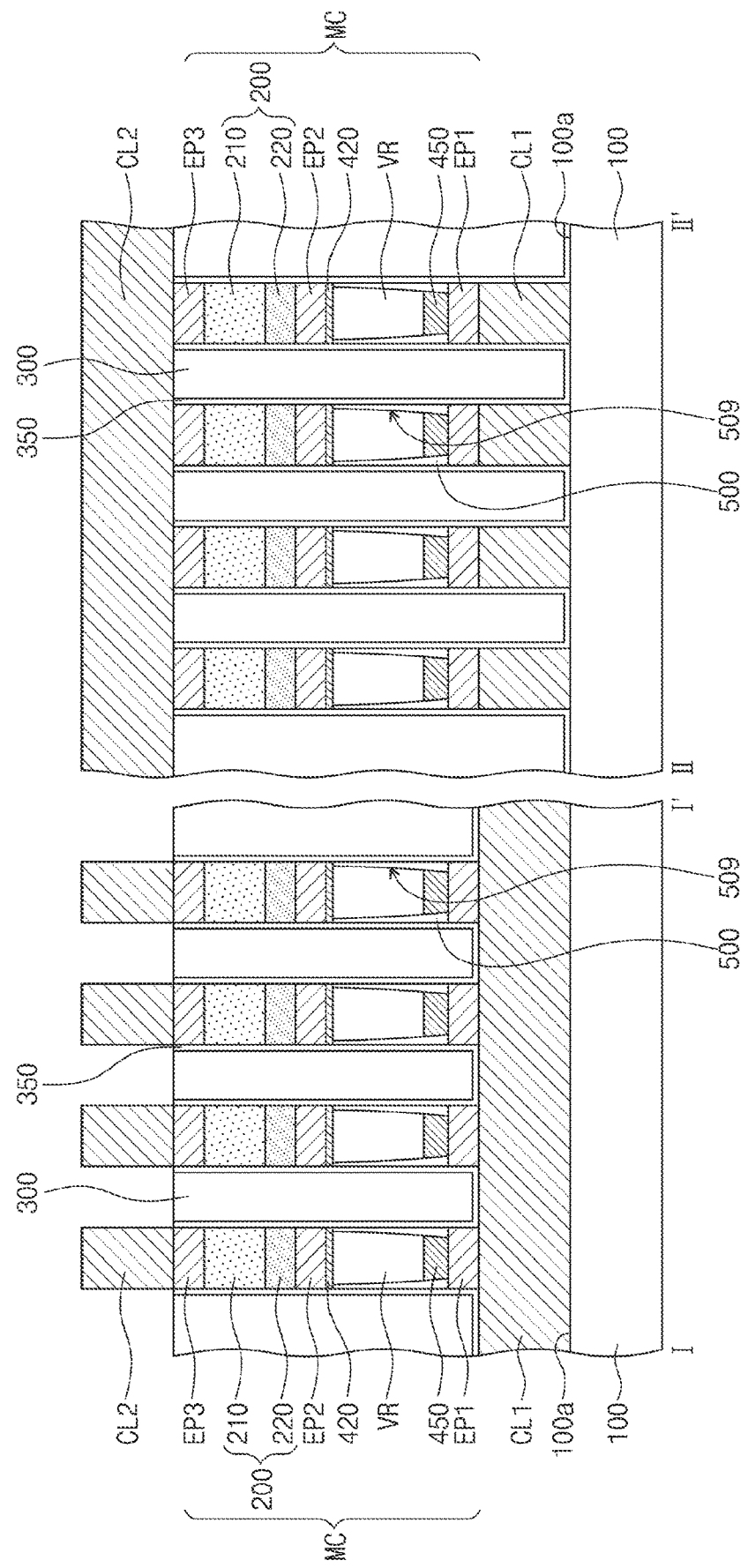
FIG. 9B is a sectional view illustrating a semiconductor device according to an exemplary embodiment of the inventive concept.

FIG. 9A is a sectional view illustrating a semiconductor device according to an exemplary embodiment of the inventive concept, taken along lines I-I' and II-II' of FIG. 3. FIG. 9B is a sectional view illustrating a semiconductor device according to an exemplary embodiment of the inventive concept, taken along lines I-I' and II-II' of FIG. 3. For concise description, a previously described element may be identified by the same reference number without repeating an overlapping description thereof. This embodiment will be described with reference to FIGS. 9A and 9B, along with FIG. 3.

Referring to FIGS. 9A and 9B, the semiconductor device may further include the insulating pattern 500, in addition to the substrate 100, the first conductive lines CL1, the memory cells MC, the mold layer 300, the second conductive lines CL2, and the passivation pattern 350. Each of the memory cells MC may include the first electrode pattern EP1, the lower barrier layer 450, the variable resistance pattern VR, the second barrier pattern 420, the second electrode pattern EP2, the selection element pattern 200, and the third electrode pattern EP3, which are sequentially stacked on the substrate 100.

The insulating pattern 500 may be interposed between the first electrode pattern EP1 and the second electrode pattern EP2. The trench 509 may expose the first electrode pattern EP1. The lower barrier layer 450 and the variable resistance pattern VR may be disposed in the trench 509. The lower barrier layer 450 may be interposed between the first electrode pattern EP1 and the variable resistance pattern VR.

As shown in FIG. 9A, the second selection element pattern 220 may be interposed between the top surface of the first selection element pattern 210 and the third electrode pattern EP3 to be in contact with the top surface of the first selection element pattern 210.

As shown in FIG. 9B, the second selection element pattern 220 may be interposed between the bottom surface of the first selection element pattern 210 and the second electrode pattern EP2 to be in contact with the bottom surface of the first selection element pattern 210.

At least one of the first barrier pattern 410, the second barrier pattern 420, and the passivation pattern 350 may be omitted from the semiconductor devices described with reference to FIGS. 6, 7A, 7B, 8A, 8B, 9A, and 9B.

In the present specification, the terms "first", "second", and "third", etc. have been used to describe various electrode patterns and conductive lines according to example embodiments of the inventive concept, but these electrode patterns and conductive lines should not be limited by these terms. These terms are only used to distinguish one electrode pattern and conductive line from another electrode pattern and conductive line. Thus, an element, which is described as a first electrode pattern in one embodiment, may be mentioned as a third electrode pattern. Similarly, an element, which is described as a first conductive line in one embodiment, may be mentioned as a second conductive line.

In a comparative example, a layer containing at least one of Te and Se and at least one of Ge, Sb, Bi, Pb, Sn, Ag, As, S, Si, In, Ti, Ga, P, O and C is deposited to form a first selection element pattern having a thickness of 220 Å. The first selection element pattern may further contain at least one of C, N, B, and O as an impurity. Further in this example, a lower electrode and an upper electrode are respectively formed on the top and bottom surfaces of the first selection element pattern. The lower electrode and the upper electrode of this example may be formed using carbon.

In an sample embodiment of the inventive concept, a first selection element pattern (e.g., 210) is formed by the same deposition method as that in the comparative example. However, the first selection element pattern in the exemplary embodiment is instead formed to have a thickness of 200 Å. Further, in the exemplary embodiment, a second selection element pattern (e.g., 220) is formed by depositing a 20 Å-thick InGaZnO film on the first selection element pattern. Accordingly, a selection element pattern (e.g., 200) with the first and second selection element patterns is fabricated. A lower electrode (e.g., EP1) and an upper electrode (e.g., EP2) are respectively formed on top and bottom surfaces of the selection element pattern. In this sample embodiment of the inventive concept, the lower electrode and the upper electrode are formed using carbon.

Figure 10:
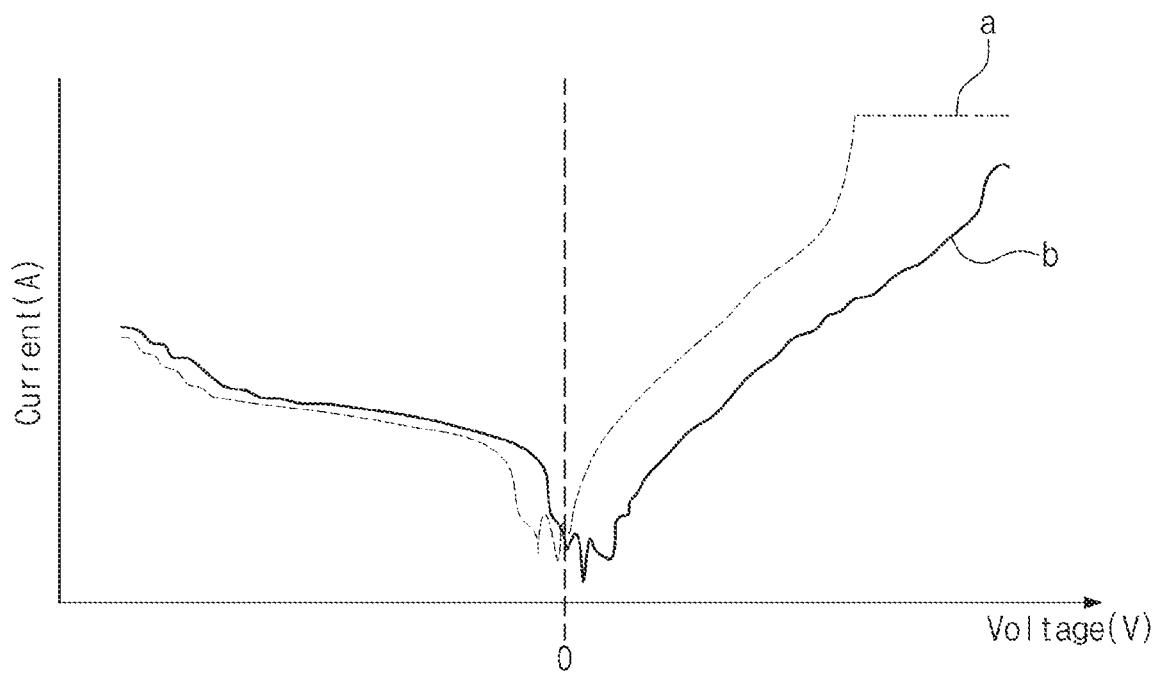
FIG. 10 is a graph showing current-voltage characteristics of a selection element pattern according to an experimental example.

FIG. 10 is a graph showing exemplary current-voltage characteristics derived from a change in current during a voltage sweep measured from a selection element pattern of the above-described sample embodiment. The voltage sweep was repeated three times. In FIG. 10, the curve (b) shows the measurement result that was obtained through the first voltage sweep when a test device was turned on. The curve (a) shows the measurement result that was obtained through the third voltage sweep.

FIG. 10 shows that the selection element pattern according to the sample embodiment has a rectifying function. According to an exemplary embodiment of the inventive concept, since the first and second selection element patterns form a pn junction, a selection element pattern including them may exhibit a rectifying property.

If a switching operation (i.e., on-off) is repeatedly performed on the selection element pattern of the comparative example and the sample embodiment until each selection element pattern exhibits an abnormal current-voltage behavior or the switching operation fails, the comparative example is more likely to experience the abnormal current-voltage behavior or the switching operation failure first. The iteration number in below Table 1 represents the maximum iteration number of the switching operation which was performed without encountering such a problem.

Table 1 shows endurance characteristics of the selection element patterns according to the comparative example and the sample embodiment.

TABLE 1

|  | Comparative example | Sample Embodiment |
| --- | --- | --- |
| Iteration number (times) | $1.1 \times 10^8$ | $1 \times 10^9$ |

Referring to Table 1 and FIG. 4, the iteration number was greater in the selection element pattern 200 according to the sample embodiment than in the selection element pattern according to the comparative example. This result shows that the selection element pattern 200 according to at least one embodiment of the inventive concept has improved endurance characteristics, compared with the comparative example. In addition, this result shows that the improved electric characteristics (such as leakage current and threshold voltage) of the selection element pattern 200 can be maintained for a long time, even when the operation of the selection element pattern 200 is repeated.

According to at least one exemplary embodiment of the inventive concept, a selection element pattern of a variable resistance memory device includes a first selection element pattern and a second selection element pattern. The second selection element pattern may be coupled to the first selection element pattern to form a pn junction. Accordingly, during the operations of the semiconductor device, the selection element pattern may behave as a rectifying element, thereby making it possible to improve electrical characteristics (e.g., threshold voltage and/or leakage current) of the selection element pattern. As a result, reliability and endurance characteristics of the semiconductor device may be improved.

While exemplary embodiments of the inventive concept have been particularly shown and described, it will be understood by one of ordinary skill in the art that variations in form and detail may be made therein without departing from the spirit and scope of the disclosure.

What is claimed is:

1. A variable resistance memory device comprising:
a plurality of memory cells arranged on a substrate, each of the memory cells comprising a selection element pattern and a variable resistance pattern stacked on the substrate,
wherein the selection element pattern comprises:
a first selection element pattern including a chalcogenide material; and
a second selection element pattern including a metal oxide and coupled to the first selection element pattern,
wherein the first selection element pattern has a first conductivity type and the second selection element pattern has a second conductivity type different from the first conductivity type.

2. The variable resistance memory device of claim 1, wherein the second selection element pattern forms a pn junction with the first selection element pattern.

3. The variable resistance memory device of claim 1, wherein the second selection element pattern has an energy band gap greater than an energy band gap of the first selection element pattern.

4. The variable resistance memory device of claim 3, wherein the energy band gap of the first selection element pattern ranges from 1.1 eV to 2.25 eV, and the energy band gap of the second selection element pattern ranges from 2.3 eV to 4.0 eV.

5. The variable resistance memory device of claim 3, wherein the chalcogenide material comprises at least one of tellurium (Te) and selenium (Se) and at least one of germanium (Ge), antimony (Sb), bismuth (Bi), lead (Pb), tin (Sn), silver (Ag), arsenic (As), sulfur (S), silicon (Si), Indium (In), titanium (Ti), gallium (Ga), phosphorus (P), oxygen (O), and carbon (C), and the metal oxide of the second selection element pattern comprises oxygen (O) and at least one of zinc (Zn), indium (In), gallium (Ga), and tin (Sn).

6. The variable resistance memory device of claim 1, wherein each of the memory cells further comprises a first electrode, a second electrode, and a third electrode stacked on the substrate, the selection element pattern is disposed between the first and second electrodes, the variable resistance pattern is disposed between the second and third electrodes, the first selection element pattern is in contact with one of the first and second electrodes, and the second selection element pattern is in contact with the other of the first and second electrodes.

7. The variable resistance memory device of claim 6, wherein the second selection element pattern is interposed between the first electrode and the first selection element pattern.

8. The variable resistance memory device of claim 1, further comprising:
first conductive lines arranged in parallel with one another on the substrate and extending in a first direction; and
a second conductive line extending in a second direction crossing the first conductive lines,
wherein the memory cells are disposed at respective intersection regions of the first conductive lines and the second conductive line.

9. The variable resistance memory device of claim 1, wherein a thickness of the second selection element pattern is 5% to 17% of a thickness of the first selection element pattern.

10. A semiconductor device, comprising:
a plurality of first conductive lines disposed on a substrate and spaced apart from each other;
a plurality of memory cells disposed on the first conductive lines, respectively, each of the memory cells comprising a selection element pattern and a variable resistance pattern stacked on the substrate; and
a second conductive line connected to the memory cells, the second conductive line crossing the first conductive lines,
wherein the selection element pattern comprises:
a first selection element pattern including a chalcogenide material; and
a second selection element pattern including a metal oxide in direct contact with the first selection element pattern,
wherein the second selection element pattern has a conductivity type different from that of the first selection element pattern.

11. The semiconductor device of claim 10, wherein the second selection element pattern has an energy band gap greater than that of the first selection element pattern.

12. The semiconductor device of claim 10, wherein each of the memory cells further comprises a first electrode, a second electrode, and a third electrode, the selection element pattern is disposed between the first and second electrodes, the variable resistance pattern is disposed between the second and third electrodes, the first selection element pattern is in contact with one of the first and second electrodes, and the second selection element pattern is in contact with the other of the first and second electrodes.

13. The semiconductor device of claim 10, wherein each of the memory cells further comprises:
an insulating pattern having a trench; and
a lower barrier layer provided in a lower region of the trench, wherein the variable resistance pattern is disposed on a top surface of the lower barrier layer to fill a remaining empty region of the trench.

14. The semiconductor device of claim 10, wherein a thickness of the first selection element pattern ranges from 80 Å to 300 Å, and a thickness of the second selection element pattern ranges from 4 Å to 50 Å.

15. A variable resistance memory device comprising:
a substrate;
a first conductive line disposed on the substrate and extending in a first direction;

a second conductive line disposed on the first conductive line and extending in a second direction crossing the first direction; and a memory cell disposed between the first and second conductive lines and at an intersection of the first and second conductive lines, wherein the memory cell comprises:

a selection element pattern;

a variable resistance pattern disposed on the selection element pattern;

a first electrode disposed between the selection element pattern and the first conductive line;

a second electrode between the selection element pattern and the variable resistance pattern; and a third electrode disposed between the variable resistance pattern and the second conductive line, and wherein the selection element pattern comprises:

a first selection element pattern including a chalcogenide material; and a second selection element pattern including a metal oxide and coupled to the first selection element pattern, wherein the second selection element pattern forms a pn junction with the first selection element pattern.

16. The variable resistance memory device of claim 15, wherein the second selection element pattern has an energy band gap greater than that of the first selection element pattern.

17. The variable resistance memory device of claim 15, wherein each of the memory cells further comprises a barrier pattern interposed between the second electrode and the variable resistance pattern, and the variable resistance pattern is spaced apart from the second electrode.

18. The variable resistance memory device of claim 15, wherein each of the memory cells further comprises a barrier pattern interposed between the variable resistance pattern and the third electrode, and the variable resistance pattern is spaced apart from the third electrode.

* * * * *